United States Patent
Yoshida et al.

(10) Patent No.: US 6,392,450 B2
(45) Date of Patent: May 21, 2002

(54) COMPARING CIRCUIT AND DEMODULATOR CIRCUIT USING SAME

(75) Inventors: Akira Yoshida; Takashi Taya, both of Chiba (JP)

(73) Assignee: Oki Electric Industry CO, Ltd., Tokyo (JP)

( * ) Notice: Subject to any disclaimer, the term of this patent is extended or adjusted under 35 U.S.C. 154(b) by 0 days.

(21) Appl. No.: 09/860,766

(22) Filed: May 21, 2001

(30) Foreign Application Priority Data

May 22, 2000 (JP) ........................................ 2000-149593

(51) Int. Cl.[7] ................................................ H03K 5/22
(52) U.S. Cl. ........................................... 327/72; 327/68
(58) Field of Search .............................. 327/72, 73, 68, 327/69, 70, 530, 531, 532, 307, 362

(56) References Cited

U.S. PATENT DOCUMENTS

| | | | |
|---|---|---|---|
| 4,339,727 A | * 7/1982 | Kage et al. | ..................... 327/72 |
| 5,142,554 A | * 8/1992 | Stribling et al. | ............... 327/72 |
| 5,459,417 A | * 10/1995 | Hsieh et al. | ................... 327/72 |

FOREIGN PATENT DOCUMENTS

JP 6-37822 7/1992

* cited by examiner

*Primary Examiner*—Toan Tran
(74) *Attorney, Agent, or Firm*—Rabin & Berdo, P.C.

(57) ABSTRACT

A comparing circuit which suppresses an electric power consumption and promptly traces a DC offset when shifting to a receiving mode. The comparing circuit which needs to trace a DC offset potential is provided with means for enabling power down control functions of a reference voltage generating part and a voltage comparing part on the output side of the part to be independently controlled. In the receiving mode of an apparatus in which the comparing circuit is installed, the reference voltage generating part and voltage comparing part are made operative. In a transmitting mode of the apparatus, only the reference voltage generating part is made operative. In a pause mode of the apparatus, the reference voltage generating part and voltage comparing part are set in a power down state. In the transmitting mode, by allowing the reference voltage generating part to continuously generate a reference potential for example, it is possible to promptly trace the DC offset when the apparatus is subsequently shifted to the receiving mode.

4 Claims, 5 Drawing Sheets

| MODE | PD1 | PD2 | PD3 |
|---|---|---|---|
| RECEIVING MODE | "L" | "L" | "H" |
| TRANSMITTING MODE | "L" | "H" | "L" |
| PAUSE MODE | "H" | UNSPECIFIED (DON'T CARE) | UNSPECIFIED (DON'T CARE) |

COMPARING CIRCUIT AND DEMODULATOR CIRCUIT USING SAME

BACKGROUND OF THE INVENTION

1. Field of the Invention

The invention relates to a comparing circuit for use in a receiving apparatus of a radio communication system for mobile communication or the like, and also relates to a demodulator circuit using the comparing circuit.

2. Description of Related Art

In the case of an FSK (Frequency Shift Keying) signal which is often used in a radio communication system for example, an offset occurs in a DC potential of a demodulation signal due to an influence of a difference between a frequency of the FSK signal and a predetermined carrier frequency. A demodulator circuit which needs to trace the DC offset potential, therefore, has been proposed in, for example, in Japanese Patent Kokai No. 6-37822 or the like.

Figure 1:
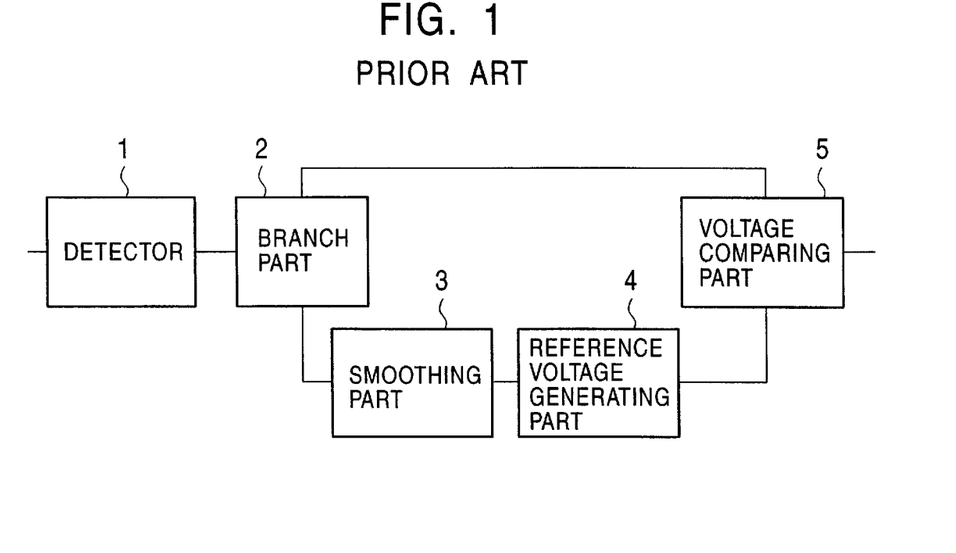
FIG. 1 is a block diagram of a conventional demodulator circuit.

FIG. 1 is a constructional diagram of a conventional demodulator circuit disclosed in this document.

In the demodulator circuit, a demodulation signal obtained by detecting a reception signal by a detector 1 is branched by a branch part 2 in order to trace the DC offset. One of the branched demodulation signals is smoothed by a smoothing part 3 comprising a capacitor. A DC offset voltage is detected by a reference voltage generating part 4 comprising a voltage dividing resistor, and a reference potential is generated and sent to a voltage comparing part 5. The voltage comparing part 5 compares the reference potential sent from the reference voltage generating part 4 with the other demodulation signal branched by the branch part 2 and generates an output signal at a logic level ("H" or "L" level) according to a comparison result.

In a transmitting and receiving apparatus in a certain kind of radio communication system, a transmission signal and a reception signal are divided by a time sharing fashion. Further, besides a case where a transmitting mode and a receiving mode are switched consecutively, there is a case where a pause mode (that is, a mode in which although a power voltage has been applied, it is neither the transmitting mode nor the receiving mode) exists in a switching period. The reception signal, therefore, reaches the receiving apparatus like a burst signal at a time when the transmitting and receiving apparatus is switched to the receiving mode, and a DC potential of the demodulation signal at this time becomes dynamic. To demodulate the signal without causing a data error, it is necessary to trace the dynamic offset potential.

In the conventional demodulator circuit of FIG. 1, however, the reference potential which is supplied to the voltage comparing part 5 is generated by the reference voltage generating part 4 on the basis of the resistance voltage division between a power voltage Vcc and the ground. Therefore a problem existed such that a DC path (that is, a DC current flowing between the power voltage Vcc and the ground) exists even when the transmitting and receiving apparatus is in the transmitting mode or pause mode and a current consumption is caused. Furthermore, if it is intended to suppress an electric power consumption in the transmitting mode, it is necessary to turn off (shut off) the whole power source of the demodulator circuit. Since an enough time is needed to settle the output of the reference voltage generating part 4 just after the shift to the receiving mode, there is a problem of the delay of a timing to trace a fluctuation of the incoming dynamic offset.

OBJECTS AND SUMMARY OF THE INVENTION

It is an object of the invention to solve the problems of the conventional arrangements and to provide a comparing circuit which can promptly trace a DC offset when an operating mode is shifted to a receiving mode while suppressing an electric power consumption and a demodulator circuit using the comparing circuit.

To solve these problems, according to the first aspect of the invention, there is provided a comparing circuit which traces a DC offset potential, comprising: a reference voltage generating part having voltage generating means to which an AC signal whose DC potential fluctuates is supplied and which detects the DC offset potential on the basis of the AC signal and generates a reference potential and first control means for shutting off a power current flowing in the voltage generating means and controlling the voltage generating means to a power down state; and a voltage comparing part having comparing means to which the AC signal and the reference potential are supplied and which compares a voltage level of the AC signal with a voltage level of the reference potential and generates an output signal at a logic level according to a result of the comparison and second control means for shutting off a power current flowing in the comparing means and controlling the comparing means to the power down state. In the receiving mode, the reference voltage generating part and the voltage comparing part are made operative. In the transmitting mode, the reference voltage generating part is made operative and the voltage comparing part is set to the power down state by the second control means. In the pause mode, the reference voltage generating part and the voltage comparing part are set to the power down state by the first and second control means.

By using the above construction, in the receiving mode, the reference voltage generating part and the voltage comparing part are made operative, the reference potential is generated by the reference voltage generating part, and the reference potential is compared with the AC signal by the voltage comparing part. In the transmitting mode, the voltage comparing part is set to the power down state by the second control signal and only the reference voltage generating part is made operative. When the operating mode is shifted from the transmitting mode to the receiving mode, it is thus possible to promptly trace the DC offset. In the pause mode, the reference voltage generating part and the voltage comparing part are set to the power down state by the first and second control means and the electric power consumption is suppressed.

According to the second aspect of the invention, there is provided a comparing circuit which traces a DC offset potential, comprising: a reference voltage generating part having voltage generating means to which an AC signal whose DC potential fluctuates is supplied and which smoothes the AC signal by a voltage dividing resistor and a capacitor, detects the DC offset potential, and generates a reference potential and switching means for shutting off a power current flowing in the voltage dividing resistor and controlling the voltage generating means to a power down state; and a voltage comparing part having comparing means to which the AC signal and the reference potential are supplied and which compares a voltage level of the AC signal with a voltage level of the reference potential and generates an output signal at a logic level according to a result of the comparison and control means for shutting off a power current flowing in the comparing means and controlling the comparing means to the power down state. In the receiving mode, the reference voltage generating part and the voltage comparing part are made operative. In the transmitting mode, the reference voltage generating part is made operative and the voltage comparing part is set to the power down state by the control means. In the pause mode, the reference voltage generating part and the voltage comparing part are set to the power down state by the switching means and the control means.

By using the above construction, in the receiving mode, the reference voltage generating part and the voltage comparing part are made operative, the reference potential is generated by the reference voltage generating part, the reference potential is compared with the AC signal by the voltage comparing part, and an output signal according to a result of the comparison is generated. In the transmitting mode, the voltage comparing part is set to the power down state by the control means and only the reference voltage generating part is made operative. When the operating mode is shifted from the transmitting mode to the receiving mode, therefore, it is possible to promptly trace the DC offset. In the pause mode, the reference voltage generating part and the voltage comparing part are set to the power down state by the switching means and the control means and the electric power consumption is suppressed.

According to the third aspect of the invention, there is provided a demodulator circuit which traces a DC offset potential, comprising: a detecting circuit having detecting means for detecting a reception signal and generating an AC signal whose DC potential fluctuates and third control means for shutting off a power current flowing in the detecting means and controlling the detecting means to the power down state; and a comparing circuit according to the first aspect of the invention. In the receiving mode, the detecting circuit and the comparing circuit are made operative. In the transmitting mode, the reference voltage generating part is made operative, and the voltage comparing part and the detecting circuit are set to the power down state by the second and third control means. In the pause mode, the comparing circuit and the detecting circuit are set to the power down state by the first, second, and third control means.

By using the above construction, in the receiving mode, the detecting circuit and the comparing circuit are made operative. The reception signal is detected by the detecting circuit and the AC signal (that is, the demodulation signal) is compared by the comparing circuit. In the transmitting mode, only the reference voltage generating part is made operative, and the voltage comparing part and the detecting circuit are set to the power down state by the second and third control means. When the operating mode is, thus, ink shifted from the transmitting mode to the receiving mode, it is possible to promptly trace the DC offset. In the pause mode, the comparing circuit and the detecting circuit are set to the power down state by the first, second, and third control means. The electric power consumption is, thus, suppressed.

According to the fourth aspect of the invention, there is provided a demodulator circuit which needs to trace a DC offset potential, comprising: a detecting circuit having detecting means for detecting a reception signal and generating an AC signal whose DC potential fluctuates and power down control means for shutting off a power current flowing in the detecting means and controlling the detecting means to the power down state; and a comparing circuit according to the second aspect of the invention. In the receiving mode, the detecting circuit and the comparing circuit are made operative. In the transmitting mode, the reference voltage generating part is made operative and the voltage comparing part and the detecting circuit are set to the power down state by the control means and the power down control means. In the pause mode, the comparing circuit and the detecting circuit are set to the power down state by the switching means, the control means, and the power down control means.

By using the above construction, the operation almost similar to that of the demodulator circuit according to the third aspect of the invention is performed.

DETAILED DESCRIPTION OF THE PREFERRED EMBODIMENTS

Figure 2:
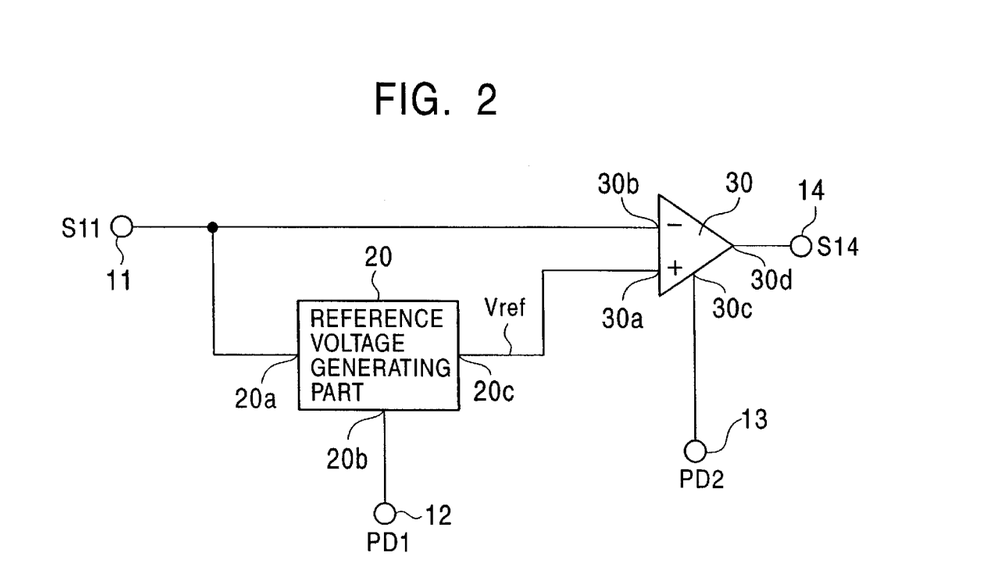
FIG. 2 is a block diagram of a comparing circuit according to the first embodiment of the invention.

FIG. 2 is a construction diagram of a comparing circuit according to the first embodiment of the invention.

The comparing circuit is provided in a receiving apparatus of a transmitting and receiving apparatus constructing, for example, a radio communication system and has input terminals 11, 12, and 13 and an output terminal 14. The input terminal 11 is connected to, for example, an output terminal of a detecting circuit and is a terminal to which an AC signal (that is, demodulation signal) S11 which was detected by the detecting circuit and whose DC potential fluctuates is supplied. The input terminals 12 and 13 are terminals to which, for example, power down control signals PD1 and PD2 are supplied, respectively. The output terminal 14 is a circuit for generating an output signal S14. A digital signal processing circuit or the like is connected to the output terminal 14. The digital signal processing circuit or the like detects a communicating mode (for example, a receiving mode, a transmitting mode, or a pause mode) of the transmitting and receiving apparatus, generates the control signals PD1 and PD2 at the logic level on the basis of the detection result, and supplies them to the input terminals 12 and 13.

An input terminal 20a of a reference voltage generating part 20 is connected to the input terminal 11. An inverting input terminal 30b of a voltage comparing part 30 is connected to the input terminal 11. Besides the input terminal 20a, the reference voltage generating part 20 has a control terminal 20b connected to the input terminal 12 and an output terminal 20c for generating a reference potential Vref. The reference voltage generating part 20 has: voltage generating means for detecting a DC offset potential on the basis of the demodulation signal S11 that is supplied from the input terminal 20a and generating the reference potential Vref; and first control means for shutting off a power current flowing in the voltage generating means on the basis of the control signal PD1 that is supplied from the control terminal 20b and controlling the voltage generating means to the power down state. The output terminal 20c is connected to a non-inverting input terminal 30a of the voltage comparing part 30.

The voltage comparing part 30 has: comparing means for comparing the reference potential Vref that is supplied from the non-inverting input terminal 30a with a voltage level of the demodulation signal S11 that is supplied from the inverting input terminal 30b and generating the output signal S14 at the logic level according to a comparison result from an output terminal 30d; and second control means for shutting off a power current flowing in the comparing means on the basis of the control signal PD2 that is supplied from a control terminal 30c and controlling the comparing means to a power down state.

The operation (1) in the receiving mode, the operation (2) in the transmitting mode, and the operation (3) in the pause mode of the comparing circuit constructed as mentioned above will be described.

The comparing circuit of FIG. 2 is constructed on the assumption that, for example, when the control signals PD1 and PD2 at the "H" level are supplied to the input terminals 12 and 13, the reference voltage generating part 20 and voltage comparing part 30 are set to the power down state and no electric power consumption is generated as a prerequisite.

(1) Operation in the Receiving Mode

When the demodulation signal S11 whose DC potential fluctuates is supplied to the input terminal 11, the demodulation signal S11 is sent to the inverting input terminal 30b of the voltage comparing part 30 and sent to the input terminal 20a of the reference voltage generating part 20. The reference voltage generating part 20 smoothes the demodulation signal S11 supplied from the input terminal 20a, generates the smoothed DC potential as a reference potential Vref from the output terminal 20c, and sends it to the non-inverting input terminal 30a of the voltage comparing part 30. The voltage comparing part 30 compares the voltage level of the demodulation signal S11 supplied from the inverting input terminal 30b with the reference potential Vref supplied from the non-inverting input terminal 30a, generates the output signal S14 at the logic level according to a comparison result from the output terminal 30d, and sends it to the output terminal 14. This state corresponds to the receiving mode and the control signals PD1 and PD2 at the "L" level are supplied to the input terminals 12 and 13.

(2) Operation in the Transmitting Mode

When the transmitting and receiving apparatus installed in the present comparing circuit is shifted to the transmitting mode, the control signal PD1 at the "L" level is supplied to the input terminal 12 and the control signal PD2 at the "H" level is supplied to the input terminal 13. The voltage comparing part 30, therefore, is set to the power down state and no electric power consumption is generated. Since the reference voltage generating part 20 is in the operative mode, it continuously generates a preset electric potential (for example, reference potential Vref). When the apparatus is subsequently shifted to the receiving mode, therefore, the output of the reference voltage generating part 20 can be promptly set to the input signal smoothed potential.

(3) Operation in the Pause Mode

When the transmitting and receiving apparatus installed in the present comparing circuit, the control signals PD1 and PD2 at the "H" level are supplied to the input terminals 11 and 13. The reference voltage generating part 20 and voltage comparing part 30 are, therefore, set to the power down state and no electric power consumption is generated.

The first embodiment has the following effects.

A control is made in a manner such that the control terminals 20b and 30c for power down control are provided for the reference voltage generating part 20 and voltage comparing part 30 to thereby enabling the power down to be individually controlled, only the reference voltage generating part 20 is made operative in the transmitting mode of the transmitting and receiving apparatus, the reference voltage generating part 20 and voltage comparing part 30 are set to the power down state in the pause mode of the transmitting and receiving apparatus, and the reference voltage generating part 20 and voltage comparing part 30 are made operative in the receiving mode of the transmitting and receiving apparatus, so that there is an effect such that the electric power consumption can be efficiently suppressed in accordance with the operating mode of the transmitting and receiving apparatus. Further, in the transmitting mode of the transmitting and receiving apparatus, since the reference voltage generating part 20 continuously generates the reference potential Vref, there is an effect such that it is possible to promptly trace the DC offset at a point when the apparatus is subsequently shifted to the receiving mode.

Figure 3:
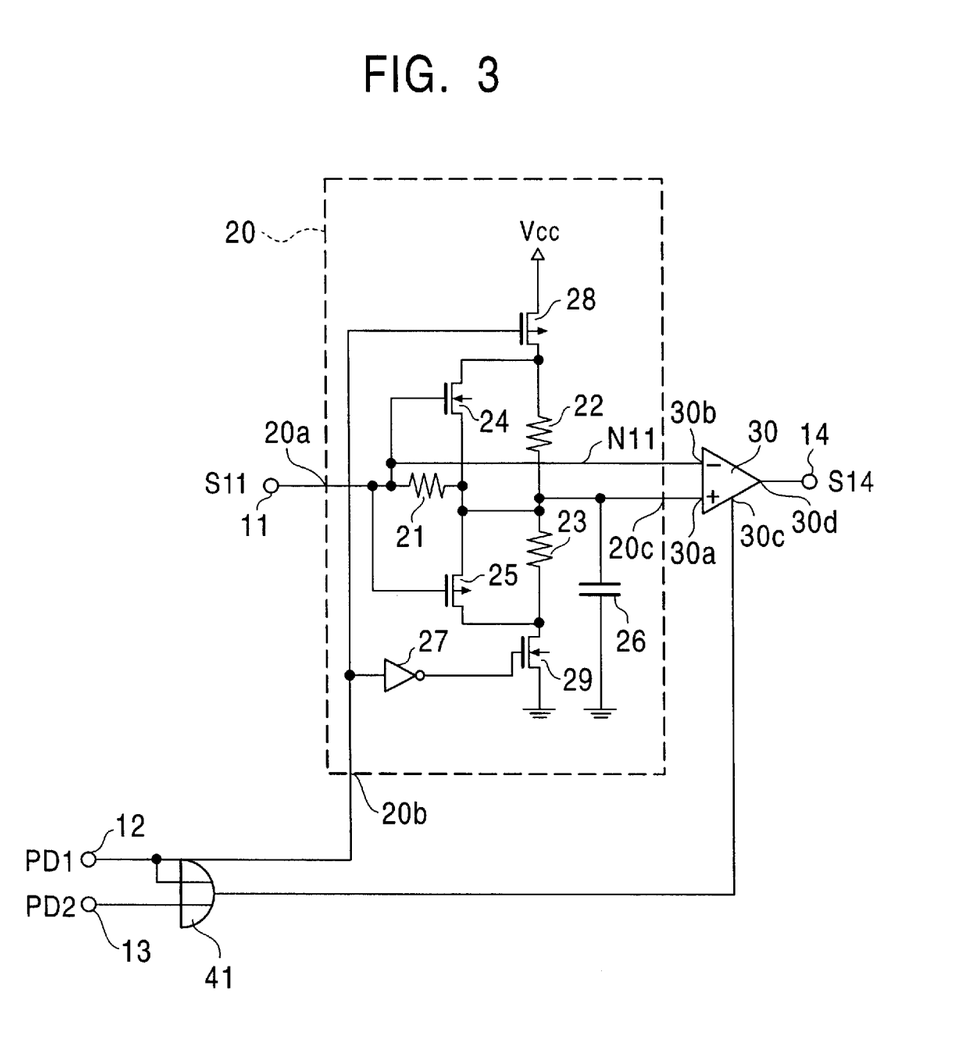
FIG. 3 is a diagram showing the construction of a comparing circuit according to the second embodiment of the invention.
Figure 4:
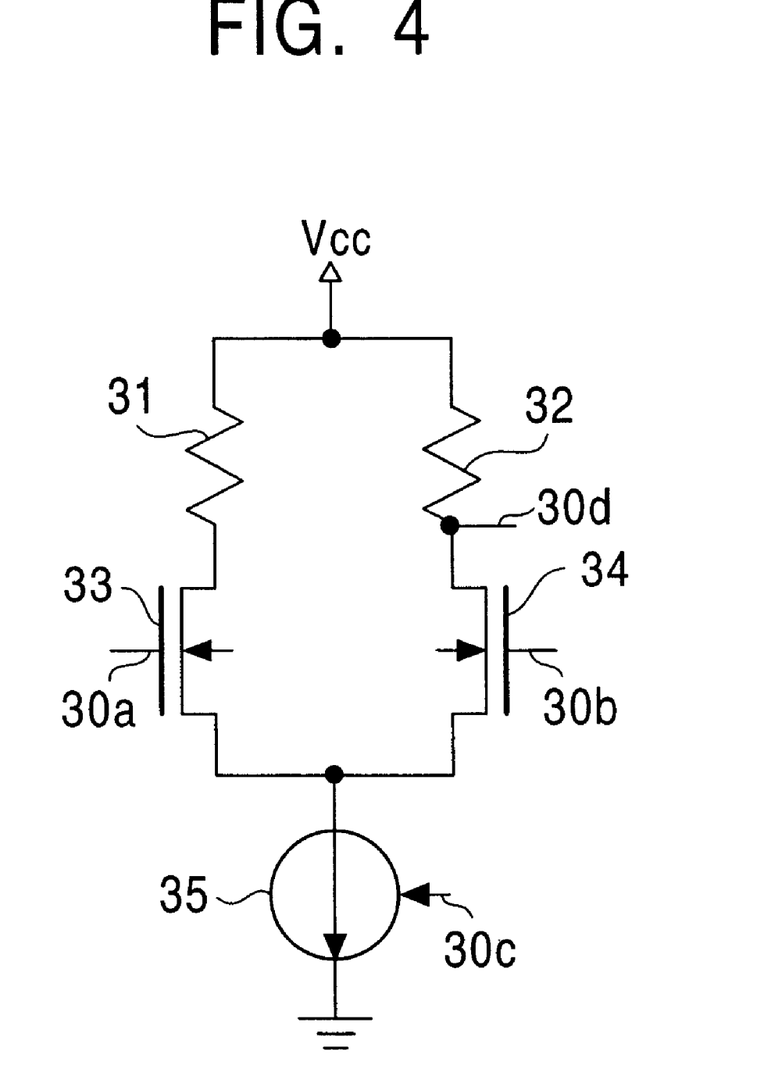
FIG. 4 is a diagram schematically showing the voltage comparing part shown in FIG. 3.

FIG. 3 is a constructional diagram of a comparing circuit showing the second embodiment of the invention. FIG. 4 is a schematic constructional diagram of a voltage comparing part in FIG. 3. The component elements common to those in FIG. 2 showing the first embodiment are designated by the same reference numerals.

In a manner similar to the first embodiment, the comparing circuit is a circuit provided in the receiving apparatus of the transmitting and receiving apparatus constructing, for example, a radio communication system.

As shown in FIG. 3, the input terminal 12 to which the power down control signal PD1 is supplied is connected to the control terminal 20b of the reference voltage generating part 20. The input terminals 12 and 13 are connected to input terminals of a 2-input OR (logical sum) circuit 41. An output terminal of the OR circuit 41 is connected to the control terminal 30c of the voltage comparing part 30.

The reference voltage generating part 20 has: voltage generating means comprising voltage dividing resistors 21, 22, and 23, an n-channel type MOS transistor (hereinafter, abbreviated to "NMOS") 24 for short-circuiting the voltage dividing resistor 22, a p-channel type MOS transistor (hereinafter, abbreviated to "PMOS") 25 for short-circuiting the voltage dividing resistor 23, and a smoothing capacitor 26; and first control means comprising an inverter (inverting circuit) 27 for inverting the control signal PD1 and switching means (for example, PMOS 28, NMOS 29).

One terminal of the voltage dividing resistor 21, a gate electrode of the NMOS 24, a gate electrode of the PMOS 25, and a node N11 are connected to the input terminal 20a connected to the input terminal 11. A source electrode of the NMOS 24, a source electrode of the PMOS 25, one terminal of the voltage dividing resistor 22, one terminal of the voltage dividing resistor 23, and the output terminal 20c are connected to the other terminal of the voltage dividing resistor 21. A drain electrode of the NMOS 24 and a drain electrode of the PMOS 28 are connected to the other terminal of the voltage dividing resistor 22. A drain electrode of the PMOS 25 and a drain electrode of the NMOS 29 are connected to the other terminal of the voltage dividing resistor 23. One terminal of the capacitor 26 and the non-inverting input terminal 30a of the voltage comparing part 30 are connected to the output terminal 20c. The other terminal of the capacitor 26 is connected to the ground.

An input terminal of the inverter 27 and a gate electrode of the PMOS 28 are connected to the control terminal 20b. A source electrode of the PMOS 28 is connected to the power voltage Vcc. An output terminal of the inverter 27 is connected to a gate electrode of the NMOS 29 and its source electrode is connected to the ground.

The voltage comparing part 30 shown in FIG. 4 is constructed by, for example, a differential amplifying circuit and comprises: comparing means having load resistors 31 and 32 and NMOSs 33 and 34; and control means (for example, constant current source 35) which is on/off controlled by the control signal PD1 or PD2. The power voltage Vcc is connected to one terminal of each of the load resistors 31 and 32. The other terminal of the load resistor 31 is connected to a drain electrode of the NMOS 33. A gate electrode of the NMOS 33 is connected to the non-inverting input terminal 30a and a source electrode is connected to one electrode of the constant current source 35. The output terminal 30d and a drain electrode of the NMOS 34 are connected to the other terminal of the load resistor 32. A gate electrode of the NMOS 34 is connected to the inverting input terminal 30b and a source electrode of the NMOS 34 is connected to one electrode of the constant current source 35. The constant current source 35 is a circuit in which the other electrode is connected to the ground and which is turned on (conductive)/off (nonconductive) on the basis of the control signal PD1 or PD2 supplied from the control terminal 30c.

The operation (1) in the transmitting mode, the operation (2) in the case where the operating mode is switched from the transmitting mode to the receiving mode, and the operation (3) in the pause mode in FIGS. 3 and 4 will now be described hereinbelow.

It is presumed as a prerequisite that, for example, when the control signal PD1 or PD2 that is supplied to the voltage comparing part 30 is at the "H" level, the voltage comparing part 30 is set to the power down state. It is also assumed that the voltage dividing resistors 22 and 23 have the same resistance value.

(1) Operation in the Transmitting Mode

During transmission, the control signal PD1 at the "L" level is supplied to the input terminal 12 and the control signal PD2 at the "H" level is supplied to the input terminal 13. An output signal of the OR circuit 41 is set to the "H" level. The control terminal 30c of the voltage comparing part 30 is set to the "H" level. The constant current source 35 in the voltage comparing part 30 is, therefore, turned off and is set to the power down state and no electric power consumption is generated. Since the control terminal 20b of the reference voltage generating part 20 is at the "L" level, however, the PMOS 28 and NMOS 29 are turned on and the electric potential at the output terminal 20c is fixed to the electric potential (reference potential Vref) obtained by resistance dividing the power voltage Vcc by the voltage dividing resistors 22 and 23, thereby consequently enabling the electric potential at the output terminal 20c when the operating mode is subsequently switched to the receiving mode to be activated from the intermediate potential of the power voltage Vcc.

(2) Operation When the Operating Mode is Switched from the Transmitting Mode to the Receiving Mode During the reception, the control signals PD1 and PD2 at the "L" level are supplied to the input terminals 12 and 13. At this time, the PMOS 28 and NMOS 29 in the reference voltage generating part 20 are ON and the potential at the output terminal 20c continuously maintains the potential (Vref) obtained by dividing the power voltage Vcc by the voltage dividing resistors 22 and 23, so that the electric potential fluctuation due to the mode switching does not occur. The DC potential at the inverting input terminal 30b of the voltage comparing part 30 is fixed to the same potential as that at the output terminal 20c through the voltage dividing resistor 21. When the demodulation signal is supplied to the input terminal 11, in case of the frequency modulation, a difference between the carrier frequency and a desired frequency appears as a DC offset potential at the node N11, so that the DC potential at the node N11 fluctuates step by step. Whether the dynamic offset potential fluctuation is in the ascending direction or the descending direction is unspecified.

As mentioned above, the potential at the output terminal 20c does not fluctuate at a point when the operating mode is switched from the transmitting mode to the receiving mode and convergence time is not necessary until the potential at the output terminal 20c is stabilized. Further, since the potential at the output terminal 20c is activated from the intermediate potential of the power voltage Vcc, it is possible to promptly trace the instantaneous dynamic offset voltage of the node N11.

For example, assuming that the potential of the node N11 rises to a value which is higher than the reference potential Vref by a threshold voltage Vthn of the NMOS 24 or more, the NMOS 24 is turned on and the capacitor 26 is promptly charged, so that the potential (Vref) at the output terminal 20c also rapidly rises. Assuming that the potential of the node N11 drops to a value which is lower than the reference potential Vref by a threshold voltage Vthp of the PMOS 25 or more, on the contrary, the PMOS 25 is turned on and the charges in the capacitor 26 are promptly discharged, so that the potential (Vref) at the output terminal 20c also rapidly decreases. Further, if the fluctuation of the potential at the node N11 is about a fluctuation which does not exceed the threshold voltage Vthn of the NMOS 24 and the threshold voltage Vthp of the PMOS 25, a DC-like potential difference between the output terminal 20c and the node N11 is small and the signal can be easily reconstructed by the voltage comparing part 30.

The present comparing circuit operates as mentioned above each time the operating mode is switched to the receiving mode, traces the steep DC offset fluctuation, and executes the signal reconstruction without an error.

(3) Operation in the Pause Mode

Since the control signal PD1 at the "H" level is supplied to the input terminal 12 when switching to the pause mode, the PMOS 28 and NMOS 29 in the reference voltage generating part 20 are turned off and set to the power down state. Further, the constant current source 35 in the voltage comparing part 30 is turned off and set to the power down state. Since the PMOS 28 and NMOS 29 are turned off in the reference voltage generating part 20, a DC path by the voltage dividing resistors 22 and 23 is not formed and no electric power consumption is generated. Similarly, since the constant current source 35 in the voltage comparing part 30 is turned off, a DC path by the load resistors 31 and 32 is not formed and no electric power consumption is generated.

The second embodiment has the following effects.

The control terminal 30c is provided for the voltage comparing part 30. The PMOS 28 and NMOS 29 as switching means which ar controlled by the power down control signal PD1 are provided across the voltage dividing resistors 22 and 23 in the reference voltage generating part 20. Further, the power down control of the voltage comparing part 30 and the switching control of the reference voltage generating part 20 can be individually controlled. When the transmitting and receiving apparatus is in the pause mode, the PMOS 28 and NMOS 29 are turned off and the constant current source 35 in the voltage comparing part 30 is turned off and set to the power down state. When the transmitting and receiving apparatus is in the transmitting mode, the PMOS 28 and NMOS 29 are turned on and only the voltage comparing part 30 is set to the power down state. When the transmitting and receiving apparatus is in the receiving mode the PMOS 28 and NMOS 29 are turned on and the constant current source 35 in the voltage comparing part 30 is turned on and made operative. There is consequently an effect that the electric power consumption can be suppressed in accordance with the operating mode of the transmitting and receiving apparatus. Further, there is an effect that when the transmitting and receiving apparatus is in the transmitting mode, the reference voltage generating part 20 continuously generates the reference voltage Vref and, when shifting to the receiving mode, it is possible to promptly trace the DC offset.

Figure 5:
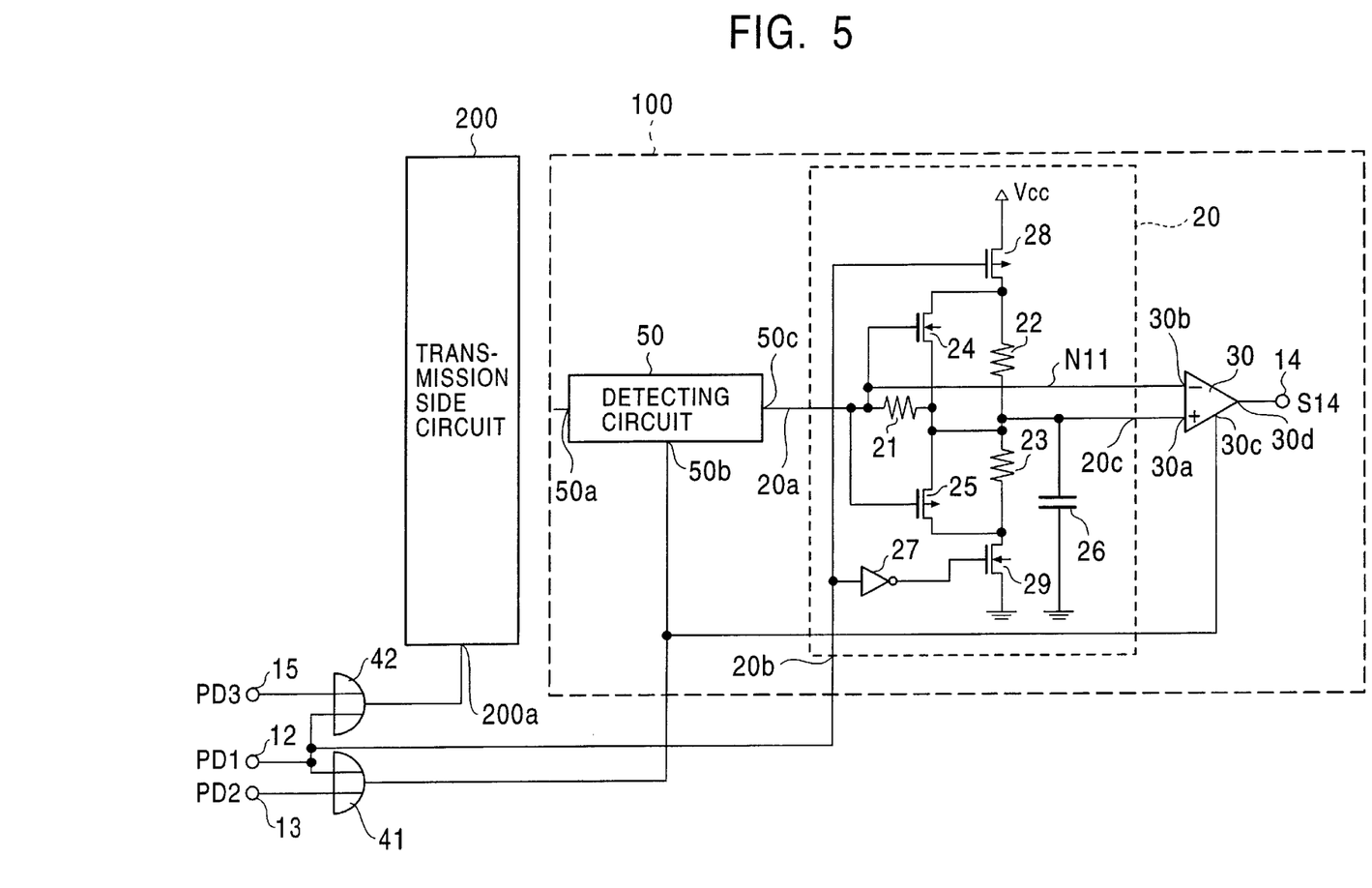
FIG. 5 is a block diagram of a demodulator circuit showing the third embodiment of the invention.

FIG. 5 is a constructional diagram of a demodulator circuit shown in the third embodiment of the invention. Component elements common to those in FIGS. 2, 3, and 4 showing the first and second embodiments are designated by the same reference numerals.

A demodulator circuit 100 is provided in the transmitting and receiving apparatus constructing, for example, the radio communication system and has a detecting circuit 50, the reference voltage generating part 20, and the voltage comparing part 30.

The detecting circuit 50 has: detecting means for receiving a reception signal from an antenna through an input terminal 50a, detecting the reception signal, and generating a demodulation signal whose DC potential fluctuates from an output terminal 50c; and third control means for receiving the power down control signal PD1 or PD2 from a control terminal 50b, shutting off a power current flowing in the detecting means, and controlling the detecting means to the power down state. The input terminal 20a of the reference voltage generating part 20 is connected to the output terminal 50c of the detecting circuit 50.

The reference voltage generating part 20 and the voltage comparing part 30 connected to an output side of the part 20 have the same construction as that in FIGS. 3 and 4.

As shown in FIG. 5, input terminals 12, 13, and 15 to which power down control signals PD1, PD2, and PD3 are supplied are provided, respectively. The input terminal 12 is connected to the control terminal 20b of the reference voltage generating part 20. The input terminals 12 and 13 are connected to input terminals of the 2-input OR circuit 41. An output terminal of the OR circuit 41 is connected to the control terminal 50b of the detecting circuit 50 and the control terminal 30c of the voltage comparing part 30. The input terminals 12 and 15 are connected to input terminals of a 2-input OR circuit 42. An output terminal of the OR circuit 42 is connected to a control terminal 200a of a transmission side circuit 200. Control means for shutting off a power current flowing in an internal circuit and controlling it to the power down state on the basis of the power down control signal PD1 or PD3 which is supplied from the control terminal 200a is provided for the transmission side circuit 200.

Figure 6:
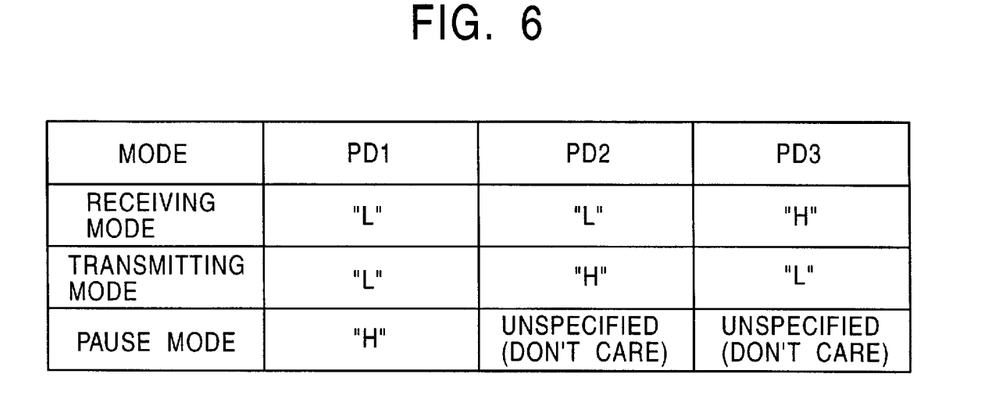
FIG. 6 is a diagram showing a communicating mode and a truth value of a power down control signal in FIG. 5.

FIG. 6 is a diagram showing the communicating mode and truth values of the power down control signals PD1, PD2, and PD3 in FIG. 5. The operation (1) in the transmitting mode, the operation (2) in case of switching from the transmitting mode to the receiving mode, and the operation (3) in the pause mode in FIG. 5 will now be described with reference to the diagram.

In the explanation of the operation, it is presumed as a prerequisite that, for example, all of the power down control signals PD1, PD2, and PD3 which are supplied to the transmission side circuit 200, detecting circuit 50, and voltage comparing part 30 are at the "H" level and they are set to the power down state. Further, it is assumed that the voltage dividing resistors 22 and 23 in the reference voltage generating part 20 are set to the same value in a manner similar to FIG. 3.

(1) Operation in the Transmitting Mode

During the transmission, the control signal PD1 at the "L" level, the control signal PD2 at the "H" level, and the control signal PD3 at the "L" level are supplied to the input terminals 12, 13, and 15, respectively. Although the transmission side circuit 200 is in the operative mode, therefore, since the control signal PD2 supplied to the input terminal 13 is at the "H" level, the detecting circuit 50 and voltage comparing part 30 in the demodulator circuit 100 are set to the power down state and no electric power consumption is generated. Since the control signal PD1 supplied to the input terminal 12 is at the "L" level, however, the PMOS 28 and NMOS 29 in the reference voltage generating part 20 are turned on and the potential at the output terminal 20c is fixed to the potential (Vref) obtained by resistance dividing the power voltage Vcc by the voltage dividing resistors 22 and 23, thereby enabling the potential at the output terminal 20c when subsequently switching to the receiving mode to be activated from the intermediate potential of the power voltage Vcc.

(2) Operation When Switching from the Transmitting Mode to the Receiving Mode

During the reception, the control signal PD1 at the "L" level, the control signal PD2 at the "L" level, and the control signal PD3 at the "H" level are supplied to the input terminals 12, 13, and 15, respectively. Since the control signal PD3 supplied to the input terminal 15 is at the "H" level, the transmission side circuit 200 is set to the power down state and no electric power consumption is generated. At this time as well, since the control signal PD1 which is supplied to the input terminal 12 is at the "L" level, the PMOS 28 and NMOS 29 in the reference voltage generating part 20 are turned on and the potential at the output terminal 20c continuously maintains the potential (Vref) obtained by dividing the power potential Vcc by the voltage dividing resistors 22 and 23, so that the potential fluctuation that is caused due to the mode switching does not occur. The DC potential at the node N11 is fixed to the same potential as that at the output terminal 20c through the voltage dividing resistor 21.

When the reception signal is detected by the detecting circuit 50 and the demodulation signal is sent to the input terminal 20a of the reference voltage generating part 20, in case of the frequency modulation, since a difference between the carrier frequency and a desired frequency appears as a DC offset potential at the node N11, the DC potential of the node N11 fluctuates step by step. Whether the dynamic offset potential fluctuation is in the ascending direction or the descending direction is unspecified. As mentioned above, the potential at the output terminal 20c does not fluctuate upon switching from the transmitting mode to the receiving mode and convergence time is unnecessary until the potential at the output terminal 20c is stabilized. Further, since the potential at the output terminal 20c is activated from the intermediate potential of the power voltage Vcc, it is possible to promptly trace the instantaneous dynamic offset voltage at the node N11.

For example, assuming that the potential of the node N11 rises to a value which is higher than the reference potential Vref by the threshold voltage Vthn of the NMOS 24 or more, the NMOS 24 is turned on and the capacitor 26 is promptly charged, so that the potential (Vref) at the output terminal 20c also rapidly rises. On the contrary, assuming that the potential of the node N11 decreases to a value which is lower than the reference potential Vref by the threshold voltage Vthp of the PMOS 25 or more, the PMOS 25 is turned on and the charges in the capacitor 26 are promptly discharged, so that the potential (Vref) at the output terminal 20c also rapidly decreases. Further, if the fluctuation of the potential of the node N11 is about a value which does not exceed the threshold voltage Vthn of the NMOS 24 and the threshold voltage Vthp of the PMOS 25, the DC-like potential difference between the output terminal 20c and the node N11 is small and the signal can be easily reconstructed by the voltage comparing part 30.

The present demodulator circuit operates as mentioned above each time the operating mode is switched to the receiving mode, traces the steep DC offset fluctuation, and executes the signal reconstruction without an error.

(3) Operation in the Pause Mode

When switching from the transmitting mode to the pause mode, since the control signal PD1 at the "H" level is supplied to the input terminal 12, all of the demodulator circuit 100 and transmission side circuit 200 are set to the power down state. Further, the PMOS 28 and NMOS 29 in the reference voltage generating part 20 are also turned off, a DC path by the voltage dividing resistors 22 and 23 is not formed, and no electric power consumption is generated. Similarly, the constant current source 35 in the voltage comparing part 30 is also turned off, a DC path by the load resistors 31 and 32 is not formed, and no electric power consumption is generated.

When shifting to the pause mode, the PMOS 28 and NMOS 29 in the reference voltage generating part 20 are turned off, further, the detecting circuit 50 is also set to the power down state, and the output terminal 50c of the detecting circuit 50 is released, so that the output terminal 20c in the reference voltage generating part 20 is set to a floating state. The charges accumulated in the capacitor 26, therefore, are neither charged nor discharged. The potential at the output terminal 20c is continuously maintained to the intermediate potential (Vref) of the power voltage Vcc set in the transmitting mode. In case of shifting from the pause mode to the receiving mode, the output terminal 20c does not cause the potential fluctuation from the intermediate potential of the power voltage Vcc. The operation is, therefore, executed in a manner similar to that in case of shifting from the transmitting mode to the receiving mode mentioned above.

The third embodiment has the following effects.

The control terminals 200a, 50b, and 30c to which the power down control signals are supplied are provided for the transmission side circuit 200 and the detecting circuit 50 and voltage comparing part 30 in the demodulator circuit 100. The PMOS 28 and NMOS 29 as switching means which is controlled by the power down control signal are provided across the voltage dividing resistors 22 and 23 in the reference voltage generating part 20. Further, the power down control of the transmission side circuit 200, detecting circuit 50, and voltage comparing part 30 and the control of the PMOS 28 and NMOS 29 of the reference voltage generating part 20 can be individually controlled. When the transmitting and receiving apparatus is in the pause mode, the PMOS 28 and NMOS 29 are turned off. All of the other transmission side circuit 200, detecting circuit 50, and voltage comparing part 30 are set to the power down state. When the transmitting and receiving apparatus is in the transmitting mode, the transmission side circuit 200 is made operative. The PMOS 28 and NMOS 29 in the reference voltage generating part 20 are turned on. The detecting circuit 50 and voltage comparing part 30 are set to the power down state. When the transmitting and receiving apparatus is in the receiving mode, only the transmission side circuit 200 is set to the power down state. There is consequently an effect that the electric power consumption can be suppressed in accordance with the operating mode of the transmitting and receiving apparatus. Further, there is an effect that when the transmitting and receiving apparatus is in the transmitting mode and the pause mode, the reference voltage generating part 20 continuously generates the reference voltage Vref and can promptly trace the DC offset when shifting to the receiving mode.

The invention is not limited to the above embodiments but many modifications and use embodiments are possible. As modifications and use embodiments, for example, there are the following examples (a) and (b).

(a) Although the comparing circuit in FIG. 2 is provided in The receiving apparatus, it can be also applied to an apparatus other than the receiving apparatus, or the like.

(b) The reference voltage generating part 20 and voltage comparing part 30 shown in FIGS. 3, 4, and 5 can be also constructed by the other circuits using transistors or the like other than those shown in the diagrams. Although the examples of the transmitting and receiving apparatus of the radio communication system have been described as an applied apparatus in FIGS. 3 and 5, the invention can be also similarly applied to an apparatus which needs to trace the steep fluctuation of the DC potential like an optical receiving apparatus which handles a burst signal, or the like.

As described in detail above, according to the first aspect of the invention, in the comparing circuit which needs to trace the DC offset potential, the means for enabling the power down control functions of the reference voltage generating part and the voltage comparing part to be independently controlled is provided, the reference voltage generating part and the voltage comparing part are made operative in the receiving mode, only the reference voltage generating part is made operative in the transmitting mode, and the reference voltage generating part and the voltage comparing part are set to the power down state in the pause mode. There is, consequently, an effect that the electric power consumption can be efficiently suppressed in accordance with the operating mode of the apparatus in which the comparing circuit of the invention is installed. Further, there is an effect that, for example, by constructing the apparatus in a manner such that the reference voltage generating part continuously generates the reference voltage in the transmitting mode of the apparatus, it is possible to promptly trace the DC offset at a point when the operating mode is subsequently shifted to the receiving mode.

According to the second aspect, in the comparing circuit which needs to trace the DC offset potential, the switching means for controlling the on state and off state of the DC path of the voltage dividing resistors for generation of the reference voltage in the reference voltage generating part is provided, the means for enabling the switching means to be controlled independent of the power down control of the voltage comparing part is further provided, only the reference voltage generating part is made operative in the transmitting mode of the apparatus in which the comparing circuit of the invention is installed, and the reference voltage generating part and the voltage comparing part are set to the power down state in the pause mode of the apparatus. There is, consequently, an effect that the electric power consumption can be suppressed in accordance with the operating mode of the apparatus in which the comparing circuit of the invention is installed. Further, there is an effect that, for example, by constructing the apparatus in a manner such that the reference voltage generating part continuously generates, for example, the reference voltage when the apparatus is in the transmitting mode, it is possible to promptly trace the DC offset when the operating mode is shifted to the receiving mode.

According to the third and fourth aspects of the invention, in the demodulator circuit which needs to trace the DC offset potential, for example, only the transmission side circuit and the reference voltage generating part in the demodulator circuit are made operative in the transmitting mode of the apparatus in which the demodulator circuit of the invention is installed, only the demodulating circuit is made operative in the receiving mode of the apparatus, and for example, all of the transmission side circuit and the demodulator circuit are set to the power down state in the pause mode of the apparatus. There is, consequently, an effect that the electric power consumption can be suppressed in accordance with the operating mode of the apparatus in which the demodulator circuit of the invention is installed. Further, for example, by constructing the apparatus in a manner such that the reference voltage generating part continuously generates the reference voltage when the apparatus is in the transmitting mode and the pause mode, it is possible to promptly trace the DC offset when the operating mode is shifted to the receiving mode.

What is claimed is:

1. A comparing circuit comprising:
   a reference voltage generating part having voltage generating means to which an AC signal whose DC potential fluctuates is supplied and which detects a DC offset potential on the basis of said AC signal and generates a reference potential and first control means for shutting off a power current flowing in said voltage generating means and controlling said voltage generating means to a power down state; and
   a voltage comparing part having comparing means to which said AC signal and said reference potential are supplied and which compares a voltage level of said AC signal with a voltage level of said reference potential and generates an output signal at a logic level according to a result of said comparison and second control means for shutting off a power current flowing in said comparing means and controlling said comparing means to the power down state,
   wherein in a receiving mode, said reference voltage generating part and said voltage comparing part are made operative, in a transmitting mode, said reference voltage generating part is made operative and said voltage comparing part is set to the power down state by said second control means, and in a pause mode, said reference voltage generating part and said voltage comparing part are set to the power down state by said first and second control means.

2. A comparing circuit comprising:
   a reference voltage generating part having voltage generating means to which an AC signal whose DC potential fluctuates is supplied and which smoothes said AC signal by a voltage dividing resistor and a capacitor, detects a DC offset potential, and generates a reference potential and switching means for shutting off a power current flowing in said voltage dividing resistor and controlling said voltage generating means to a power down state; and
   a voltage comparing part having comparing means to which said AC signal and said reference potential are supplied and which compares a voltage level of said AC signal with a voltage level of said reference potential and generates an output signal at a logic level according to a result of said comparison and control means for shutting off a power current flowing in said comparing means and controlling said comparing means to the power down state,
   wherein in a receiving mode, said reference voltage generating part and said voltage comparing part are made operative, in a transmitting mode, said reference voltage generating part is made operative and said voltage comparing part is set to the power down state by said control means, and in a pause mode, said reference voltage generating part and said voltage comparing part are set to the power down state by said switching means and said control means.

3. A demodulator circuit comprising:
   a detecting circuit having detecting means for detecting a reception signal and generating an AC signal whose DC potential fluctuates and third control means for shutting off a power current flowing in said detecting means and controlling said detecting means to a power down state; and
   a comparing circuit which comprises
   a reference voltage generating part having voltage generating means to which the AC signal whose DC potential fluctuates is supplied and which detects a DC offset potential on the basis of said AC signal and generates a reference potential and first control means for shutting off a power current flowing in said voltage generating means and controlling said voltage generating means to the power down state and
   a voltage comparing part having comparing means to which said AC signal and said reference potential are supplied and which compares a voltage level of said AC signal with a voltage level of said reference potential and generates an output signal at a logic level according to a result of said comparison and second control means for shutting off a power current flowing in said comparing means and controlling said comparing means to the power down state, and
   in which in a receiving mode, said reference voltage generating part and said voltage comparing part are made operative, in a transmitting mode, said reference voltage generating part is made operative and said voltage comparing part is set to the power down state by said second control means, and in a pause mode, said reference voltage generating part and said voltage comparing part are set to the power down state by said first and second control means,
   wherein in the receiving mode, said detecting circuit and said comparing circuit are made operative, in the transmitting mode, said reference voltage generating part is made operative and said voltage comparing part and said detecting circuit are set to the power down state by said second and third control means, and in the pause mode, said comparing circuit and said detecting circuit are set to the power down state by said first, second, and third control means.

4. A demodulator circuit comprising:
   a detecting circuit having detecting means for detecting a reception signal and generating an AC signal whose DC potential fluctuates and power down control means for shutting off a power current flowing in said detecting means and controlling said detecting means to a power down state; and
   a comparing circuit which comprises a reference voltage generating part having voltage generating means to which the AC signal whose DC potential fluctuates is supplied and which smoothes said AC signal by a voltage dividing resistor and a capacitor, detects a DC offset potential, and generates a reference potential and switching means for shutting off a power current flowing in said voltage dividing resistor and controlling said voltage generating means to the power down state and a voltage comparing part having comparing means to which said AC signal and said reference potential are supplied and which compares a voltage level of said AC signal with a voltage level of said reference potential and generates an output signal at a logic level according to a result of said comparison and control means for shutting off a power current flowing in said comparing means and controlling said comparing means to the power down state, and in which in a receiving mode, said reference voltage generating part and said voltage comparing part are made operative, in a transmitting mode, said reference voltage generating part is made operative and said voltage comparing part is set to the power down state by said control means, and in a pause mode, said reference voltage generating part and said voltage comparing part are set to the power down state by said switching means and said control means, wherein in the receiving mode, said detecting circuit and said comparing circuit are made operative, in the transmitting mode, said reference voltage generating part is made operative and said voltage comparing part and said detecting circuit are set to the power down state by said control means and said power down control means, and in the pause mode, said comparing circuit and said detecting circuit are set in the power down state by said switching means, said control means, and said power down control means.

* * * * *